(12) United States Patent
Adenau

(10) Patent No.: US 11,259,438 B2
(45) Date of Patent: Feb. 22, 2022

(54) LIGHTING CONTROL CONSOLE HAVING A COOLING DEVICE

(71) Applicant: MA LIGHTING TECHNOLOGY GMBH, Waldbüttelbrunn (DE)

(72) Inventor: Michael Adenau, Würzburg (DE)

(73) Assignee: MA LIGHTING TECHNOLOGY GMBH, Waldbüttelbrunn (DE)

( * ) Notice: Subject to any disclaimer, the term of this patent is extended or adjusted under 35 U.S.C. 154(b) by 301 days.

(21) Appl. No.: 16/336,701

(22) PCT Filed: Sep. 25, 2017

(86) PCT No.: PCT/EP2017/074190
§ 371 (c)(1),
(2) Date: Mar. 26, 2019

(87) PCT Pub. No.: WO2018/060123
PCT Pub. Date: Apr. 5, 2018

(65) Prior Publication Data
US 2021/0153380 A1 May 20, 2021

(30) Foreign Application Priority Data

Sep. 30, 2016 (DE) .................... 10 2016 118 598.1

(51) Int. Cl.
*H05K 7/20* (2006.01)
*H05B 47/18* (2020.01)

(52) U.S. Cl.
CPC ......... *H05K 7/20145* (2013.01); *H05B 47/18* (2020.01); *H05K 7/2039* (2013.01);
(Continued)

(58) Field of Classification Search
CPC ........... H05K 7/20145; H05K 7/20154; H05K 7/20209; H05K 7/20336; H05K 7/2039; H05B 47/18
See application file for complete search history.

(56) References Cited

U.S. PATENT DOCUMENTS 8,773,364 B2* 7/2014 Adenau ............... H05B 47/155
345/173
2001/0050430 A1* 12/2001 Vendier ............... H01L 23/427
257/717

(Continued)

FOREIGN PATENT DOCUMENTS

CN 104902728 A 9/2015
DE 10 2007 058 166 B3 5/2009

(Continued)

OTHER PUBLICATIONS

China National Intellectual Property Administration, First Office Action and Search Report, Application No. 201780005164.5, dated Jul. 17, 2019, 19 pages.

(Continued)

*Primary Examiner* — Michael A Matey
(74) *Attorney, Agent, or Firm* — Quarles & Brady LLP

(57) ABSTRACT

The disclosure relates to a lighting control console (01) for controlling a lighting system, digital adjusting commands being generated in the lighting control console (01), which commands can be transmitted to the lighting devices of the lighting system via data links, said lighting control console (01) comprising at least one digital processor (16, 17) and at least one digital memory for generating, managing and storing the adjusting commands, and said digital processor (16, 17) and said digital memory being disposed in a console housing (08), and a control panel (07) having at least one control element, in particular a key button (04) and/or at least one slide control (05) and/or at least one rotary control (06), being provided at the upper side of the console housing (08), which control panel allows users to enter control commands, and said lighting control console (01) comprising at least one screen (02), and said lighting control console (01) comprising at least one cooling device (13), with the aid of which components within the interior (12) of the console (Continued)

housing (08) can actively be cooled, wherein the cooling device (13) comprises at least one recuperator (18, 28) for indirect heat transfer, said recuperator (18, 28), on its primary side (21, 32), absorbing waste heat and transferring it to its secondary side (22, 30) by way of heat conduction without any exchange of material, and said recuperator (18, 28), on its secondary side, being configured to have a cooling agent (23) flow through it or circulate around it in order to transfer the waste heat onto the cooling agent (23).

14 Claims, 7 Drawing Sheets

(52) U.S. Cl.
CPC ..... *H05K 7/20154* (2013.01); *H05K 7/20209* (2013.01); *H05K 7/20336* (2013.01)

(56) References Cited

U.S. PATENT DOCUMENTS

| | | | |
|---|---|---|---|
| 2006/0011330 A1 | 1/2006 | Wang | |
| 2006/0077192 A1* | 4/2006 | Thielemans | G06F 3/1431 345/204 |
| 2006/0103333 A1* | 5/2006 | Toms | H05B 47/155 315/312 |
| 2007/0103447 A1* | 5/2007 | Varian | G06F 3/04895 345/173 |
| 2008/0012849 A1* | 1/2008 | Snyder | G06F 3/0362 345/418 |
| 2009/0009966 A1 | 1/2009 | Yu et al. | |
| 2009/0140667 A1 | 6/2009 | Adenau | |
| 2009/0244883 A1* | 10/2009 | Natsume | G02B 6/0018 362/85 |
| 2010/0051254 A1* | 3/2010 | Ipposhi | F28F 13/14 165/274 |
| 2010/0188025 A1* | 7/2010 | Adenau | H05B 47/18 315/313 |
| 2010/0238200 A1* | 9/2010 | Adenau | H05B 47/155 345/690 |
| 2011/0169430 A1* | 7/2011 | Kirkup | H05B 47/155 315/312 |
| 2012/0004745 A1* | 1/2012 | Adenau | H05B 47/175 700/90 |
| 2012/0292007 A1* | 11/2012 | Chiu | F28D 15/0233 165/247 |
| 2013/0249433 A1* | 9/2013 | Martello | G06F 3/048 315/292 |
| 2015/0245536 A1 | 8/2015 | Li et al. | |
| 2016/0007501 A1* | 1/2016 | Nakanishi | H05K 7/20809 165/103 |
| 2016/0018139 A1* | 1/2016 | Olsson | F25B 21/02 62/3.3 |
| 2017/0198898 A1* | 7/2017 | Ro | F21V 5/008 |
| 2017/0227210 A1* | 8/2017 | Cordes | H05B 47/10 |

FOREIGN PATENT DOCUMENTS

| | | |
|---|---|---|
| DE | 10 2014 113 888 A1 | 8/2015 |
| EP | 2293658 A2 | 3/2011 |
| EP | 2950625 A1 | 12/2015 |

OTHER PUBLICATIONS

PCT International Search Report, PCT/EP2017/074190, dated Jan. 25, 2018, 6 pages.
PCT English Language Translation of the International Preliminary Report on Patentability, PCT/EP2017/074190, dated Apr. 11, 2019, 7 pages.

* cited by examiner

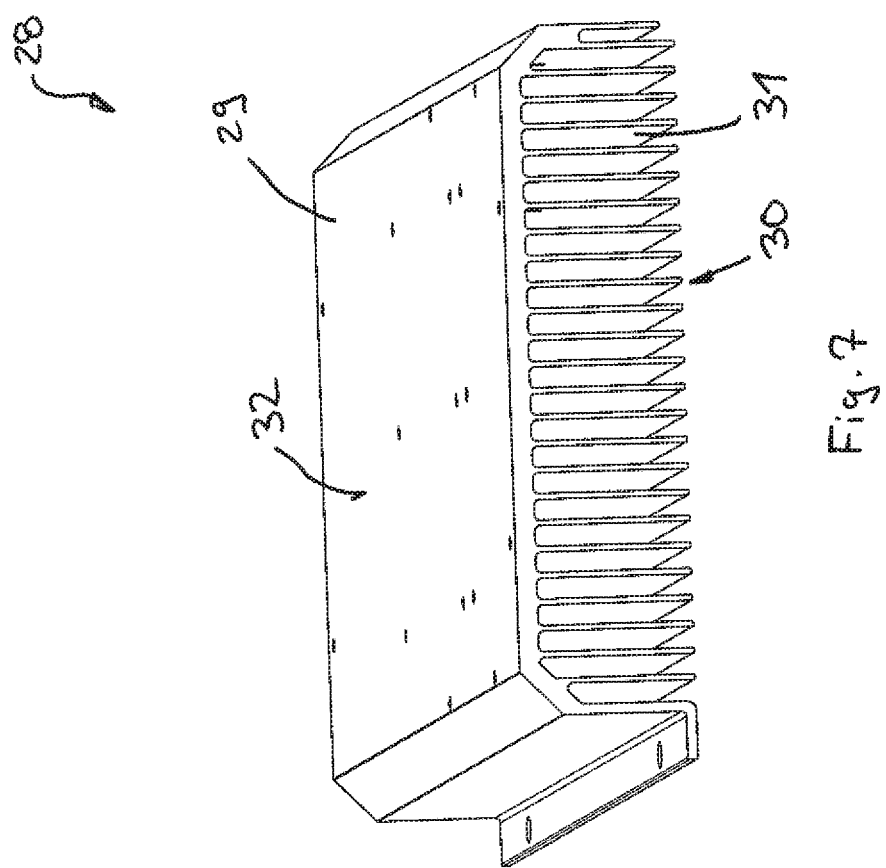

LIGHTING CONTROL CONSOLE HAVING A COOLING DEVICE

CROSS-REFERENCE TO RELATED APPLICATIONS

This application represents the national stage entry of PCT International Application No. PCT/EP2017/074190 filed on Sep. 30, 2017, which claims the benefit of German Patent Application No. 10 2016 118 598.1 filed on Sep. 30, 2016, and the entire contents of each of these priority applications are incorporated herein by reference for all purposes.

The disclosure relates to a lighting control console for controlling a lighting system, having a cooling device for actively cooling the components that are disposed within the interior of the console housing.

Generic lighting control consoles serve for controlling lighting systems such as those employed in theaters or on concert stages, for instance. Routinely, said lighting systems comprise a plurality of lighting devices, for instance stage spotlights, wherein, in the lighting devices on their own, it is in many cases also possible to switch between a plurality of lighting states, for instance between different colors. These different lighting states of the lighting devices that are in each case connected to the lighting control console can be controlled in the lighting program of the lighting control console by way of programmed parameters. Here, standard lighting systems may comprise up to several thousand lighting devices. In order to be able to control such complex lighting systems, the generic lighting control consoles are equipped with at least one digital processor, which permits digital data and signal processing. For storing the control data, a digital memory is routinely provided, which in particular allows for storing and accordingly archiving of lighting programs. For protecting the electrical and electronic components of the lighting control console, the corresponding components are installed in a console housing that shields the electrical and electronic components of the lighting control console to the outside. The electrical and electronic components of the lighting control console within the console housing generate considerable waste heat, which cannot be discharged to a sufficient degree by way of passive cooling, for instance by way of simple convection. In order to avoid damage to the electrical and electronic components of the lighting control console caused by overheating, lighting control consoles are known from the state of the art that can actively be cooled with the aid of a cooling device. Maybe a fan serves as the cooling device, with the aid of which cooling air can be sucked in from the surroundings and can be conveyed through the console housing. In contrast to standard computing units, for instance personal computers, there is the difficulty with lighting control consoles that they include a plurality of housing cut-outs in order to guide, for instance, the slide controls through the same from the inside of the housing toward the control panel at the upper side of the console housing. This plurality of cut-outs is responsible for the cooling air exiting from the interior of the console housing at a plurality of outlets so that a targeted guiding of the flow of cooling air is made virtually impossible. In order to nevertheless ensure a sufficient cooling of the components that are disposed within the interior of the console housing, it is therefore required to guide very large amounts of cooling air through the console housing. Conveying such large amounts of cooling air that are required for cooling the lighting control console with its cut-outs, however, results in considerable disadvantages. For example, undesired noise is generated by the fans that are employed for conveying the cooling air when the flow rates are correspondingly high. This noise curbs the ease of operation for the users considerably. From a technical point of view, conveying large amounts of cooling air, which is sucked out of the surroundings, is a disadvantage since large amounts of dust and suspended particulate matter are sucked into the console housing together with the cooling air. This dust and the suspended particulate matter can then deposit on the sensitive electronic components within the interior of the console housing, resulting in malfunctioning or in component failures there. In particular the slide controls are very sensitive when it comes to dust particles entering. Starting from this state of the art, it is the object of the disclosure to propose a new lighting control console having a modified cooling, with the aid of which the above-described disadvantages of the state of the art are avoided.

The lighting control console in accordance with the disclosure is based on the fundamental idea that a recuperator for indirect heat transfer is provided for cooling the components within the interior of the console housing. This recuperator is a heat exchanger, with the aid of which it is possible to transfer thermal energy from the primary side of the recuperator to the secondary side of the recuperator without any exchange of material. In this manner, the recuperator can, at its primary side, absorb waste heat from the interior of the console housing and transfer it to its secondary side. On its secondary side, the recuperator itself then has a cooling agent flow through it or circulate around it in order to transfer the waste heat onto the cooling agent and to discharge it by means of a corresponding cooling agent flow. As a result, a cooling is thus achieved thereby, with which the heat flow is decoupled from the coolant flow. Instead, the waste heat is transferred without any exchange of material by way of heat conduction within the recuperator from the primary side that is disposed within the interior of the console housing onto the secondary side that is being cooled with the aid of the cooling agent. The cooling agent itself then does not have to be passed through the interior of the console housing anymore so that the disadvantages that are known from the state of the art with regard to the noise development and the dust entry can correspondingly be decreased or avoided entirely.

It is in principle arbitrary which type of cooling agent is employed for cooling the secondary side of the recuperator. The simplest configuration results if cooling air is used as the cooling agent, which can be extracted from the surrounding atmosphere of the lighting control console without any problems and can be returned after the recuperator has been cooled. If the recuperator is installed within the interior of the console housing, it is advantageous if the console housing includes an influx opening and an outlet opening for the cooling air. A sealed flow channel then extends between the influx opening and the outlet opening, along which flow channel the cooling air can flow through the secondary side of the recuperator or circulate around it. By way of the flow channel being sealed, cooling air is prevented from uncontrollably entering the interior of the console housing in an undesired manner, resulting in undesired dust depositions there.

It is in principle arbitrary in which manner the cooling air is conveyed through the flow channel. This can be accomplished in a particular simple fashion by means of a fan that is driven electrically or by way of several fans of this kind. By driving the electrical fan, the cooling air can be conveyed into the influx opening, conveyed through the flow channel and conveyed out at the outlet opening.

The degree of efficiency of the cooling effect that can be achieved with the aid of the cooling air flow at a certain flow rate can significantly be increased by disposing air duct surfaces in the flow channel. In particular in the area of the intake opening of the electrically driven fan, disposing an air deflector is advantageous. By covering the intake opening partially, the amount of air that is sucked in with the aid of the fan can significantly be increased while the electrical drive power remains the same.

As it is already known, the cooling air contains dust and particulate matter, which can also result in undesired consequences with the cooling of the recuperator on its secondary side. For instance, the dust can deposit in the flow channel, to be precise in particular in cooling cracks, thereby increasing the flow resistance or abating the cooling effect. In order to avoid these undesired consequences of dust and particulate matter being sucked in, it is advantageous to dispose at least one air filter element in the flow channel, with the aid of which dust particles can be filtered out of the cooling air.

The design of the recuperator is in principle arbitrary. In accordance with a first construction type of the recuperator that is particularly simple, it is provided that a cooling plate from a material having a high heat conductivity is used for this. A component that generates waste heat, for instance the power supply pack of the lighting control console, is fastened on said cooling plate on its primary side. On its secondary side, the cooling plate is then disposed at a point at which the cooling agent circulates around it in order to transfer the waste heat that has been passed on in the cooling plate from the primary side to the secondary side to the cooling agent and to discharge said waste heat with the coolant flow.

With regard to a higher cooling capacity, the recuperator can, as an alternative to using a cooling plate, also be embodied in the manner of a heat sink having several cooling fins that are disposed on the secondary side. Said cooling fins have the cooling agent circulate around them for cooling the heat sink on the secondary side, wherein the cooling capacity of the recuperator can significantly be increased by way of the cooling surface that is correspondingly increased by way of the cooling fins.

For cooling the interior of the console housing in a particularly simple fashion, the recuperator can then include a cooling surface on its primary side, at which cooling surface the air within the interior of the console housing is cooled down. In this manner, an at least faint convection current results within the interior of the console housing, with which the air that is heated up at the components due to the waste heat flows to the cooling surface of the heat sink, being cooled here and then flowing back to the components that generate the waste heat. In order to increase this flow within the console housing, a fan can additionally be provided within the console housing, which circulates the air inside the console housing.

With electrical components that generate large amounts of waste heat, for instance with the processors of the main circuit board or with the processors of the graphics card, discharging the heat by way of a convection flow inside the console housing is often not sufficient. In order to be able to discharge the waste heat from these components at sufficient speed, the first end of a heat transfer element having a low thermal resistivity can be disposed on the primary side of the heat sink, the second end of said heat transfer element being disposed on the component that generates the waste heat, within the interior of the console housing. In this manner, the waste heat can then be passed on to the heat sink through the heat transfer element without any exchange of material. It is then not only the air within the interior of the console housing that serves for the heat conduction between the component that generates the waste heat and the heat sink, but the heat transfer element now also serves for this, which heat transfer element ensures, owing to its high heat conductivity, a corresponding cooling of the component by discharging the waste heat to the heat sink.

It is in principle arbitrary which type of heat transfer element is employed for the heat transfer between the component to be cooled and the heat sink. A particularly high cooling capacity can be achieved if the heat transfer element is embodied in the manner of a closed heat pipe. These heat pipes are heat transfer elements in which the closed heat pipe is filled with a working medium, in particular with water or with ammonia. Here, the pressure of the working medium within the heat pipe is chosen to have the working medium fill the volume of the heat pipe partly in a liquid state and partly in a vapor state. Here, the heat transfer inside the heat pipe is effected by using vaporization heat of the working medium circulating in the heat pipe. The thermal resistance of these closed heat pipes is very low so that a very efficient cooling of the components that generate the waste heat can be achieved by way of heat transfer onto the heat sink of the recuperator. In order to be able to produce the recuperator in a cost-effective fashion and to achieve a high heat conduction between the primary side and the secondary side at the same time, it is particularly advantageous if the cooling plate and/or the heat sink are/is produced from a metal having a low thermal resistivity. In particular copper, aluminum or brass are suitable for producing the recuperator.

In order to increase the efficiency and the process reliability of the cooling device within the lighting control console further, it is particularly advantageous if the cooling device comprises at least one temperature sensor that cooperates with a temperature control device. The temperature sensor can then be disposed within the interior of the console housing and/or in the flow channel of the cooling agent, recording temperature data there. The cooling capacity of the recuperator can then be controlled by the temperature control device as a function of the measured sensor data of the temperature sensor. In this manner, the cooling capacity of the cooling device that is summoned up in each case can be matched with the current boundary conditions, for instance the power input of the electronic components within the console housing or the outside temperature in each case.

It is in particular advantageous if the cooling capacity of the recuperator is controlled by changing the drive power of the fan that is electrically driven as a function of the sensor data of the temperature sensor in order to thereby limit the noise development to an inevitable degree.

In the drawings, one embodiment of the disclosure is schematically illustrated and will be explained by way of example in the following.

In the figures:

FIG. 7 shows the second recuperator of the cooling device in accordance with FIG. 6 in a perspective individual illustration.

Figure 1:
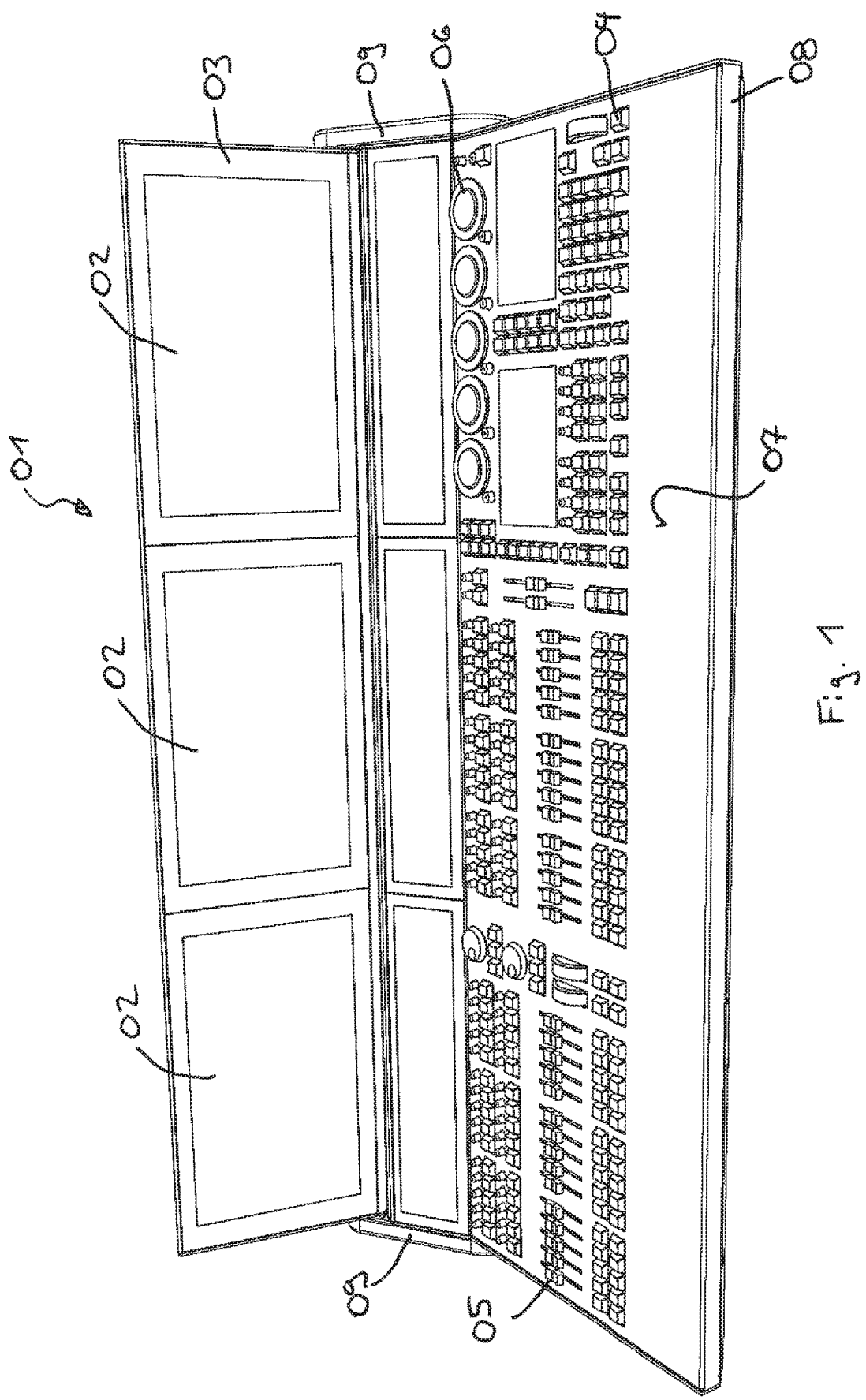
FIG. 1 shows a lighting control console in accordance with the disclosure in a perspective view from the front.

FIG. 1 shows, in a perspective view, a lighting control console 01 in accordance with the disclosure for programming and controlling a lighting system. The lighting control console 01 is equipped with three screens 02 for displaying various menus for the users. The screens 02 are on their part installed in a screen housing 03.

For entering adjusting commands, a plurality of key buttons 04, slide controls 05 and rotary controls (encoders) 06 is provided at the lighting control console 01 in a control panel 07 at the upper side of a console housing 08. A left and a right pivot arm 09 serve for the adjustable mounting of the screen housing 03 at the console housing 08. The interior of the console housing 08 exhibits a cooling device for cooling the electrical and electronic components that are incorporated in the console housing, said components being explained in the following in more detail.

Figure 2:
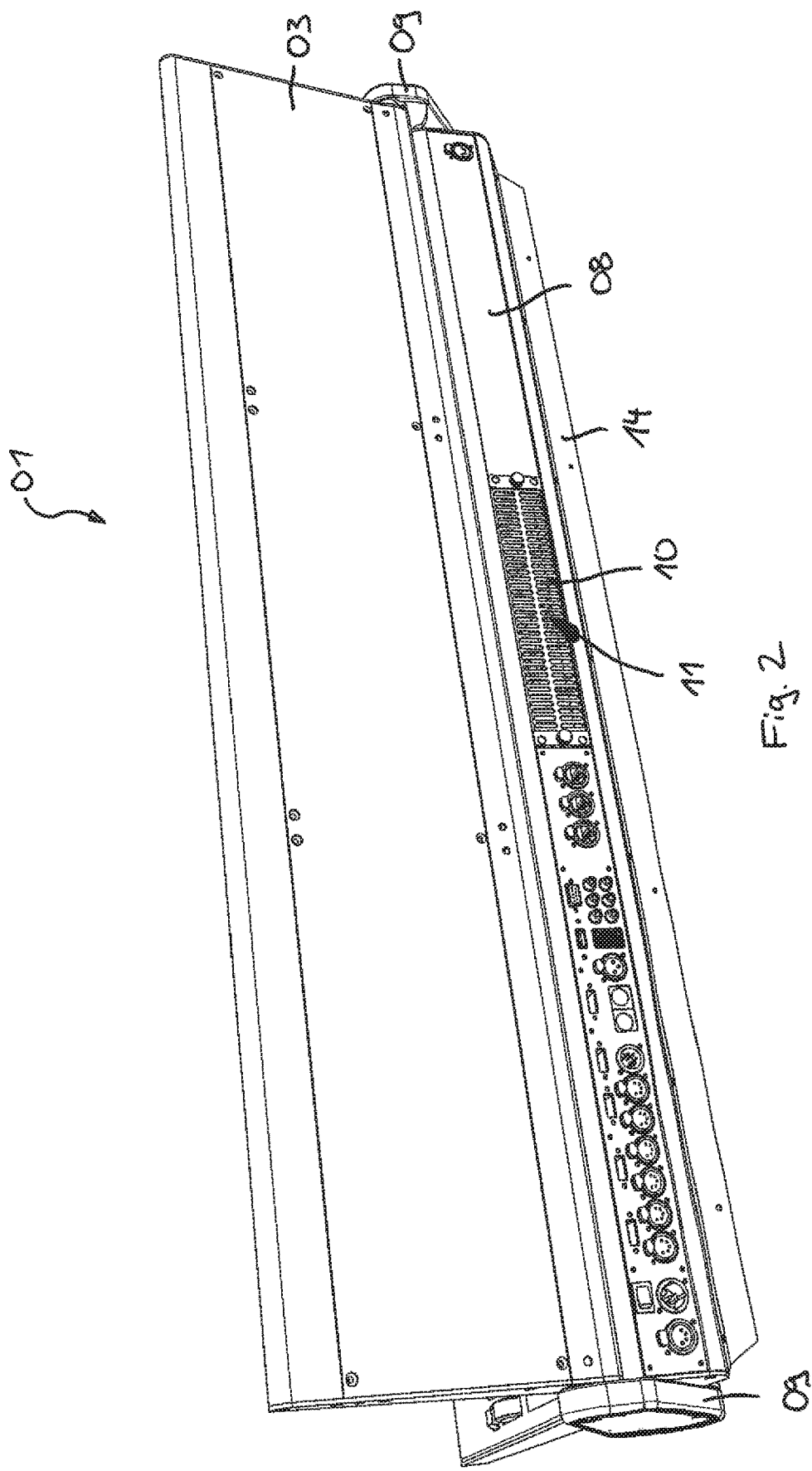
FIG. 2 shows the lighting control console in accordance with FIG. 1 in a perspective view from behind.

FIG. 2 shows the lighting control console 01 in a view from behind. An influx opening 11 that is partially covered by a protective grating 10 is located on the back of the console housing 08, through which influx opening cooling air can be sucked in from the surroundings of the lighting control console 01.

Figure 3:
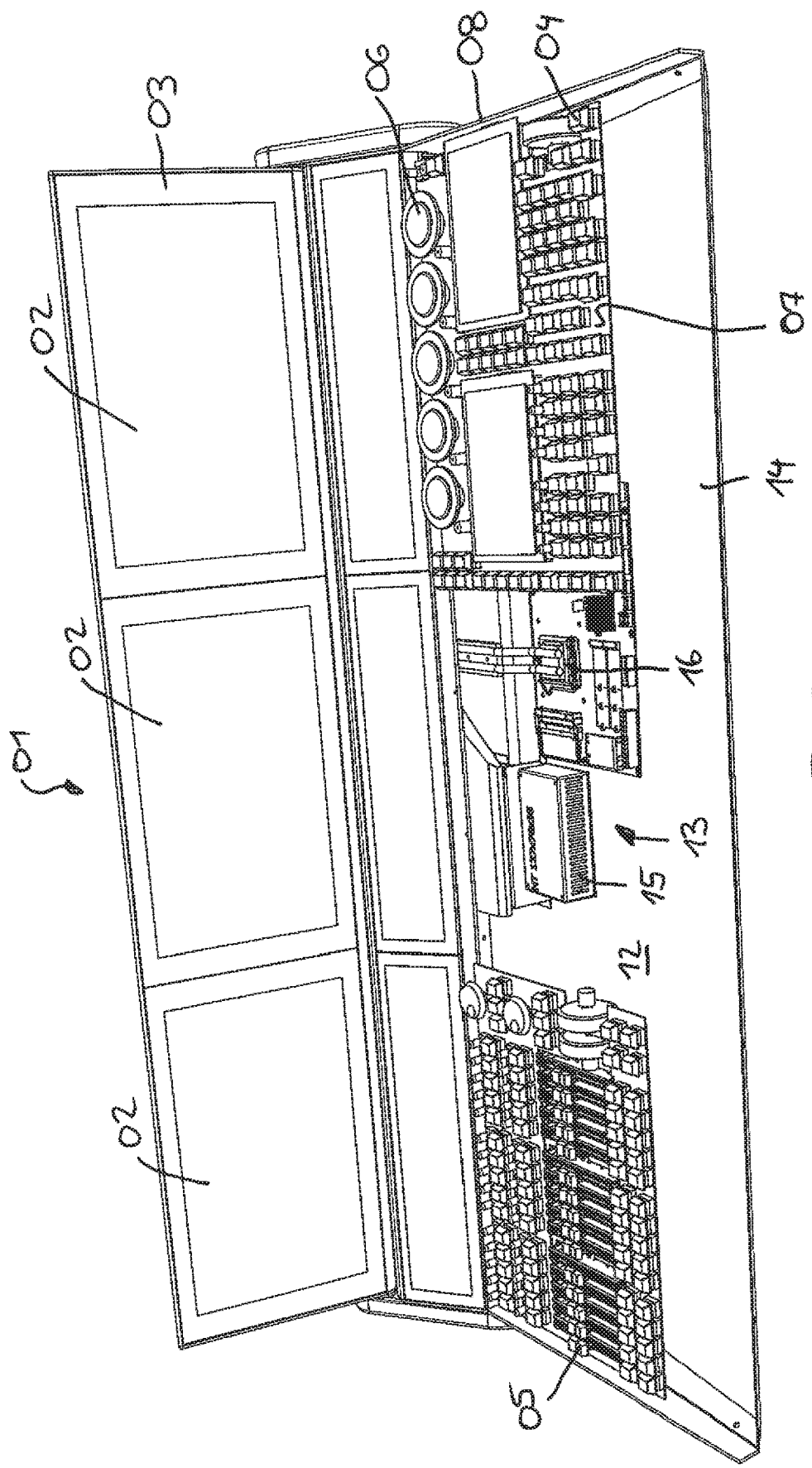
FIG. 3 shows the lighting control console in accordance with FIG. 1, having a control panel that is illustrated to be partially opened up, in a perspective view from the front.

FIG. 3 shows the lighting control console 01 having a control panel 07 that is illustrated to be partially opened up in order to clear the view into the interior 12 of the console housing at least partially. Here, only those parts among the components within the interior 12 of the console housing 01 are illustrated that are needed to understand the disclosure. A cooling device 13 is disposed behind the influx opening 11, with the aid of which cooling device the waste heat that accrues within the inside 12 can be discharged without cooling air being passed through the interior 12.

Figure 4:
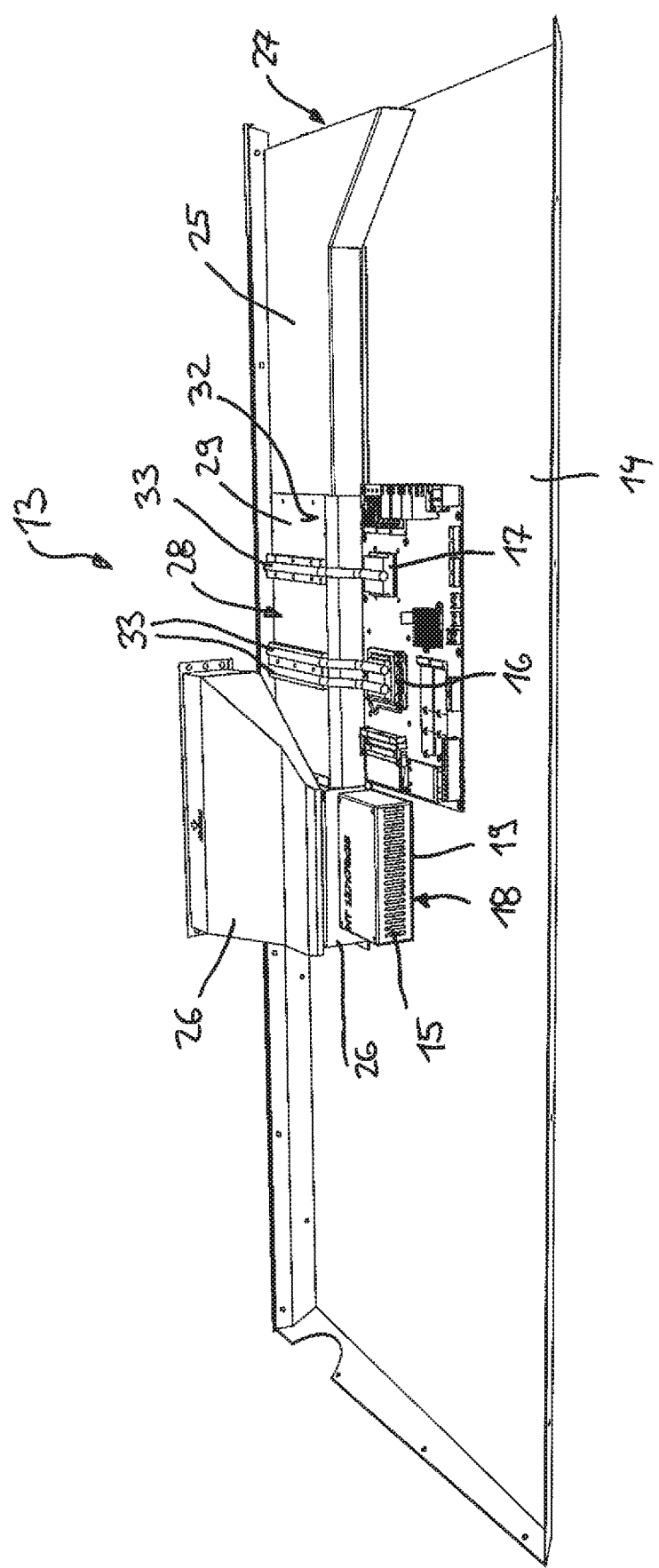
FIG. 4 shows the cooling device of the lighting control console in accordance with FIG. 1 in a perspective view from the front.
Figure 5:
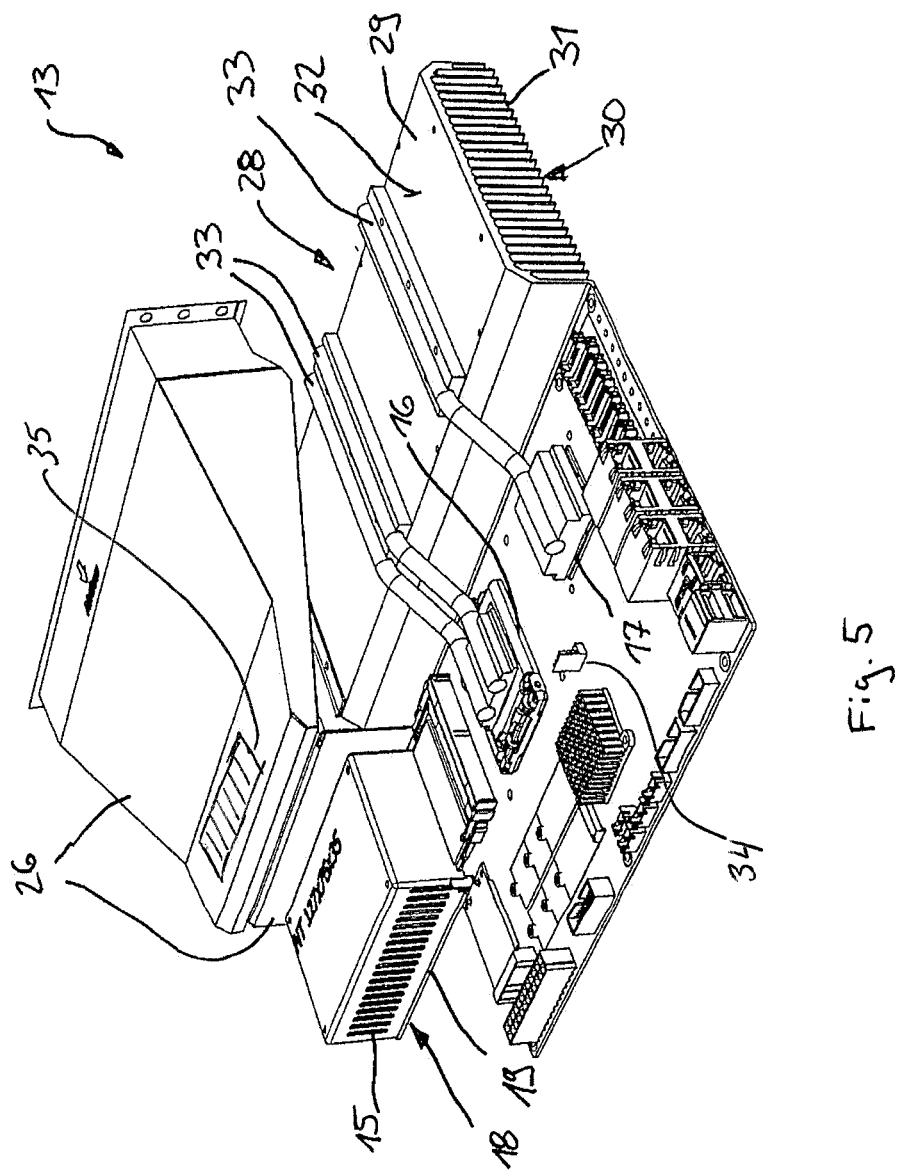
FIG. 5 shows the cooling device in accordance with FIG. 4 in an enlarged perspective view.
Figure 6:
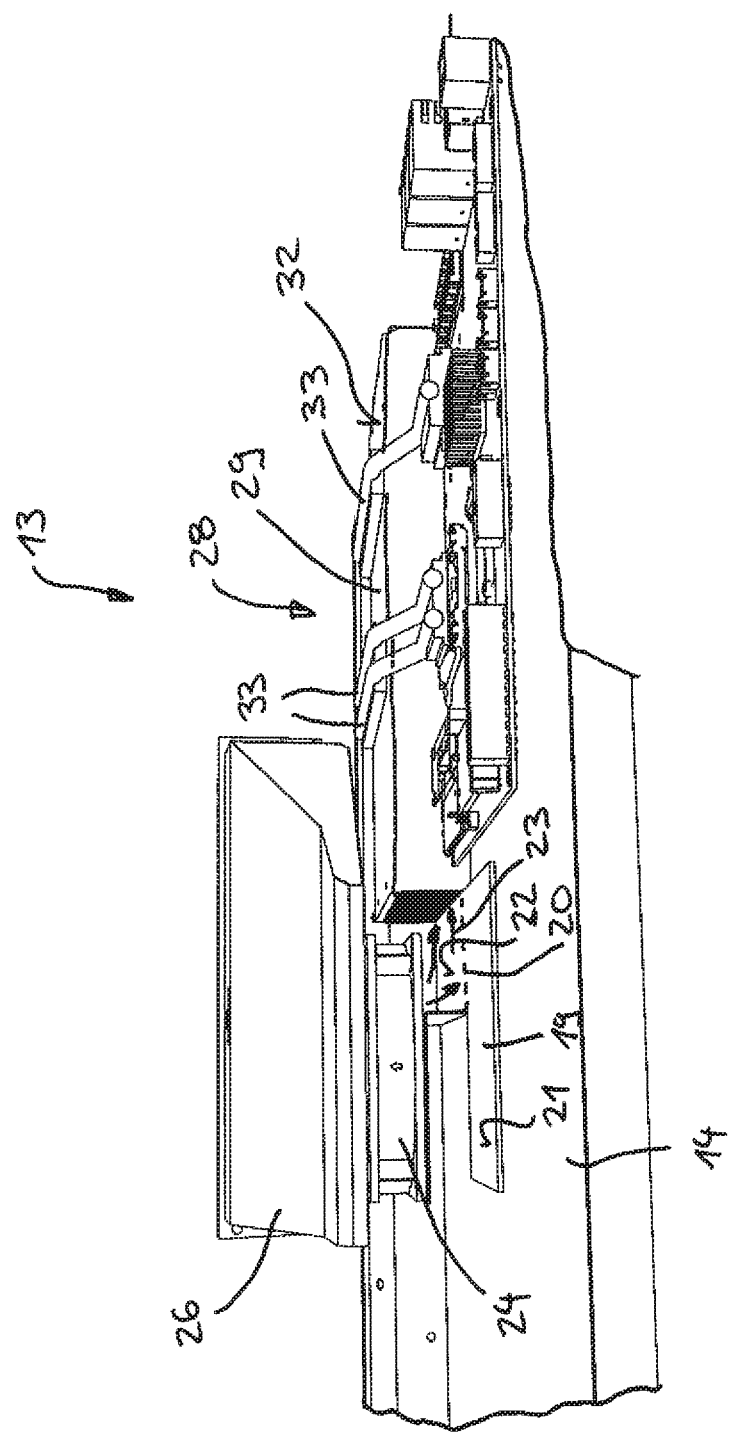
FIG. 6 shows the cooling device in accordance with FIG. 5 after a part of the flow channels has been removed, illustrating the first recuperator and the second recuperator in a perspective view from the front.

FIG. 4 to FIG. 6 show the cooling device 13 after the screen housing 03 has been removed and after the upper part of the console housing 08 has been removed. Here, the cooling device 13 is fastened on the lower part 14 of the console housing 08. The cooling device 13 in particular serves for dissipating the waste heat that is generated by a power supply pack 15 and two processors 16 and 17.

In order to discharge the waste heat of the power supply pack 15, the power supply pack 15 is fastened on a first recuperator 18, namely a cooling plate that is made of copper. How the first recuperator 18 is disposed can in particular be seen from the illustration in FIG. 6. The cooling plate 19 is L-shaped. Here, a dashed line 20 divides the upper side of the cooling plate 19 into the primary side 21 and the secondary side 22. The power supply pack 15 is fastened on the primary side 21 so that the waste heat that is generated by the power supply pack 15 is transferred onto the cooling plate 19 on its primary side. Owing to the high heat conductivity of the cooling plate 19 that consists of copper, the waste heat then flows through the cooling plate 19 to the primary side 21, a cooling air flow 23 being guided past the upper side of said primary side. Thereunto, the cooling air 23 is sucked in through the influx opening 11 by a fan 24 and is conveyed through sealed flow channels 25 and 26. The flow channels 25 and 26 consist of air baffle plates that are linked to one another and to the console housing 08 in such a way that the cooling air 23 cannot exit from the flow channel 26 into the interior 12. Instead, the entire cooling air 23 that is sucked in at the influx opening 11 is conveyed to the outlet opening 27 where it is blown off into the surroundings again. An air filter 35 can be provided in the flow channel 25 and/or 26.

After the cooling air 23 flows over the secondary side 22 of the cooling plate 19, it flows, on the secondary side, into a second recuperator 28 of the cooling device 13. The recuperator 28 is embodied in the manner of a heat sink 29 that includes a plurality of cooling fins 31 on its secondary side 30. The cooling air 23 flows past the cooling fins 31 in order to cool them. The primary side 32 of the heat sink 29 thus includes a cooled outside at which the air within the interior 12 of the console housing 08 can be cooled in order to cool the components of the lighting control console 01 that are located within the interior 12 in this manner.

Besides, the primary side 32 of the heat sink 29 is linked to the processors 16 and 17 by means of several heat pipes 33 so that the waste heat that accrues at the processors 16 and 17 can directly be passed on to the cooled primary side 32 by way of heat conduction within the heat pipes 33.

By means of a temperature sensor 34, the internal temperature within the interior 12 of the lighting control console 01 can be measured and the drive power of the fan 24 can be controlled by means of a temperature control device for maintaining a reliable peak temperature within the interior 12.

FIG. 7 shows the second recuperator of the cooling device in accordance with FIG. 6 in a perspective individual illustration.

The invention claimed is:

1. A lighting control console for controlling a lighting system, digital adjusting commands being generated in the lighting control console, which commands can be transmitted to a plurality of lighting devices of the lighting system via data links, said lighting control console comprising at least one digital processor and at least one digital memory for generating, managing and storing the digital adjusting commands, and said at least one digital processor and said at least one digital memory being disposed in a console housing, and a control panel having at least one control element, the at least one control element comprising a key button and/or at least one slide control and/or at least one rotary control, being provided at an upper side of the console housing, which control panel allows users to enter control commands, and said lighting control console comprising at least one screen, and said lighting control console comprising at least one cooling device, with the aid of which components within an interior of the console housing can actively be cooled, wherein the at least one cooling device comprises at least one recuperator for indirect heat transfer, said at least one recuperator, on its primary side, absorbing waste heat and transferring it to its secondary side by way of heat conduction without any exchange of material, and said at least one recuperator, on its secondary side, being configured to have a cooling agent flow through it or circulate around it in a flow channel in order to transfer the waste heat onto the cooling agent, at least one air filter element being disposed in the flow channel, with the aid of which dust particles can be filtered from a cooling air, and the heat transfer element being embodied in the manner of a closed heat pipe, said closed heat pipe being filled with a working medium, the working medium comprising water or ammonia, and said working medium filling a volume of the closed heat pipe partly in a liquid state and partly in a vapor state, and a heat transfer being effected in the heat pipe using vaporization heat of the working medium circulating in the heat pipe, and said cooling device comprising at least one temperature sensor that is disposed in the interior of the console housing and/or in the flow channel, and a circulating fan that is electrically driven being provided in the interior of the console housing, with the aid of which circulating fan air in the interior of the console housing is circulated, a cooling capacity of the at least one cooling device having the at least one recuperator being controlled by a temperature control device as a function of a measured sensor data of the temperature sensor, and said cooling capacity of the at least one cooling device having the at least one recuperator being controlled by changing a drive power of the circulating fan that is electrically driven as a function of the sensor data of the temperature sensor.

2. The lighting control console according to claim 1, wherein in the lighting control console, the flow channel is provided as a flow channel which is sealed toward the interior of the console housing, and in which cooling air can be conveyed from an influx opening in the console housing to an outlet opening in the console housing, the cooling air flowing through or circulating around the at least one recuperator on its secondary side in this process.

3. The lighting control console according to claim 1, wherein in the flow channel, the at least one electrically driven fan is provided, with the aid of which ambient air as cooling air can be conveyed into an influx opening, conveyed through the flow channel and conveyed out at an outlet opening.

4. The lighting control console according to claim 1, wherein at least one air deflector is disposed in the flow channel.

5. The lighting control console according to claim 4, wherein the at least one air deflector is disposed at an intake opening of the circulating fan, said air deflector partially covering the intake opening.

6. The lighting control console according to claim 1, wherein the at least one recuperator is embodied in the manner of a cooling plate, on which a component that generates waste heat, in particular a power supply pack, is fastened on the primary side, said cooling plate being cooled on the secondary side by the cooling agent.

7. The lighting control console according to claim 1, wherein the at least one recuperator is embodied in the manner of a heat sink having several cooling fins that are disposed on the secondary side, said cooling fins being configured to have said cooling agent circulate around them.

8. The lighting control console according to claim 7, wherein a primary side of the heat sink forms a cooling surface that is disposed within the interior of the console housing.

9. The lighting control console according to claim 8, wherein a first end of a heat transfer element having a low thermal resistivity is disposed on the primary side of the heat sink, a second end of said heat transfer element being disposed on a component that generates waste heat, within the interior of the console housing, in particular on a processor, and wherein the waste heat of the component can be passed on to the heat sink through the heat transfer element without any exchange of material.

10. The lighting control console according to claim 1, wherein the at least one recuperator comprises a cooling plate and/or a heat sink produced from a metal having a low thermal resistivity.

11. The lighting control console according to claim 1, wherein the at least one temperature sensor is a single temperature sensor.

12. The lighting control console according to claim 1, wherein the temperature sensor measures temperature data in the housing and/or in the flow channel.

13. The lighting control console according to claim 1, wherein the temperature sensor measures an internal temperature within an interior of the lighting control console.

14. The lighting control console according to claim 10, wherein the metal is copper, aluminum or brass.

* * * * *